(12) United States Patent
Kim et al.

(10) Patent No.: US 8,829,657 B2
(45) Date of Patent: Sep. 9, 2014

(54) SEMICONDUCTOR SUBSTRATE, SEMICONDUCTOR CHIP HAVING THE SAME, AND STACKED SEMICONDUCTOR PACKAGE

(75) Inventors: Hyun Joo Kim, Icheon-si (KR); Kang Won Lee, Icheon-si (KR); Gyu Jei Lee, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 1 day.

(21) Appl. No.: 13/614,924

(22) Filed: Sep. 13, 2012

(65) Prior Publication Data

US 2013/0264689 A1 Oct. 10, 2013

(30) Foreign Application Priority Data

Apr. 5, 2012 (KR) .................. 10-2012-0035278

(51) Int. Cl.
*H01L 29/06* (2006.01)
(52) U.S. Cl.
USPC ......................................... 257/622; 257/698

(58) Field of Classification Search
CPC ................. H01L 29/0657; H01L 2924/01079; H01L 23/473
USPC ..................... 257/74, 622, 698, 714
See application file for complete search history.

(56) References Cited

U.S. PATENT DOCUMENTS

| | | | | |
|---|---|---|---|---|
| 6,075,258 | A  * | 6/2000 | Gardner et al. | ................. 257/67 |
| 8,426,946 | B2 * | 4/2013 | Sasaki et al. | ................. 257/620 |
| 2011/0215407 | A1* | 9/2011 | Tang et al. | .................... 257/348 |
| 2012/0256310 | A1* | 10/2012 | Ide | ............................... 257/737 |

* cited by examiner

*Primary Examiner* — Tran Tran
(74) *Attorney, Agent, or Firm* — William Park & Associates Patent Ltd.

(57) ABSTRACT

A semiconductor substrate includes a substrate body divided into device regions and a peripheral region outside the device region, and having one surface, another surface substantially facing away from the one surface, trenches defined in the device regions under the one surface and inner surfaces which are formed due to defining of the trenches; active regions formed in the trenches; and a gettering layer formed between the inner surfaces of the substrate body and the active regions.

14 Claims, 5 Drawing Sheets

SEMICONDUCTOR SUBSTRATE, SEMICONDUCTOR CHIP HAVING THE SAME, AND STACKED SEMICONDUCTOR PACKAGE

CROSS-REFERENCE TO RELATED APPLICATION

The present application claims priority under 35 U.S.C. 119(a) to Korean patent application number 10-2012-0035278 filed in the Korean intellectual property office on Apr. 5, 2012, which is incorporated herein by reference in its entirety.

BACKGROUND

1. Field of the Invention

The present invention generally relates to a semiconductor substrate suitable for improving a gettering characteristic, a semiconductor chip having the same, and a stacked semiconductor package having the semiconductor chip.

2. Description of the Related Art

In the semiconductor industry, packaging technologies for integrated circuits have continuously been developed to satisfy the demand toward miniaturization and mounting reliability. Recently, as miniaturization and high performance are demanded in electric and electronic appliances, various stacking techniques have been developed.

The term "stack" that is referred to in the semiconductor industry means to vertically pile at least two semiconductor chips or semiconductor packages. In the case of a memory device, by using a stacking technology, it is possible to realize a product having memory capacity at least two times greater than that obtainable through semiconductor integration processes. Since stacked semiconductor packages have advantages in terms of not only memory capacity but also mounting density and mounting area utilization efficiency, research and development for stacked semiconductor packages have been accelerated.

As an example of a stacked semiconductor package, a structure has been proposed, in which through electrodes are formed in semiconductor chips so that upper and lower semiconductor chips are physically and electrically connected with one another by the through electrodes.

However, a substance used as the through electrodes, for example, copper, is likely to diffuse to a semiconductor chip to cause a crystal defect. As a consequence, leakage current may be induced in the semiconductor chip, and the threshold voltage of a transistor is likely to be shifted, by which a refresh characteristic may deteriorate.

In order to cope with this problem, a method has been disclosed, in which the thickness of a dielectric layer ($SiO_2$) formed between a through electrode and a semiconductor chip is increased so that copper diffusing toward the semiconductor chip can be gettered by the dielectric layer. Nevertheless, the dielectric layer is not sufficient to getter the copper diffusing from the through electrode.

SUMMARY

An embodiment is directed to a semiconductor substrate suitable for improving a gettering characteristic.

Also, an embodiment is directed to a semiconductor chip having the semiconductor substrate.

Further, an embodiment is directed to a stacked semiconductor package having the semiconductor chip.

In an embodiment, a semiconductor substrate includes: a substrate body divided into device regions and a peripheral region outside the device region, and having one surface, another surface substantially facing away from the one surface, trenches defined in the device regions under the one surface and inner surfaces which are formed due to defining of the trenches; active regions formed in the trenches; and a gettering layer formed between the inner surfaces of the substrate body and the active regions.

The active regions may include monocrystalline silicon, and the gettering layer may include polysilicon.

In another embodiment, a semiconductor chip includes: a semiconductor substrate including a substrate body divided into device regions and a peripheral region outside the device region, and having one surface, another surface substantially facing away from the one surface, trenches defined in the device regions under the one surface and inner surfaces which are formed due to defining of the trenches, active regions formed in the trenches, and a gettering layer formed between the inner surfaces of the substrate body and the active regions; semiconductor devices formed on the active regions; and through electrodes passing through the peripheral region of the substrate body.

The active regions may include monocrystalline silicon, and the gettering layer may include polysilicon.

The semiconductor devices may include at least one selected from the group consisting of an image sensor, a memory semiconductor, a system semiconductor, a passive element, an active element, and a sensor semiconductor.

The semiconductor chip may further include a circuit pattern formed over the one surface of the substrate body and the active regions, and the circuit pattern may include: bonding pads formed on a first surface of the circuit pattern substantially facing away from a second surface of the circuit pattern which substantially faces the one surface of the substrate body and the active regions, and electrically connected with the through electrodes; wiring lines electrically connecting the semiconductor devices with the bonding pads; and a dielectric layer isolating the semiconductor devices and the wiring lines from each other, the wiring lines from each other, and the wiring lines and the bonding pads from each other.

The through electrodes may pass through the circuit pattern and may be directly connected with the bonding pads. Unlike this, the through electrodes may not pass through the circuit pattern, and the circuit pattern may further include additional wiring lines which electrically connect the through electrodes and the bonding pads with each other.

In another embodiment, a stacked semiconductor package includes: a plurality of semiconductor chips each including a semiconductor substrate including a substrate body divided into device regions and a peripheral region outside the device region, and having one surface, another surface substantially facing away from the one surface, trenches defined in the device regions under the one surface and inner surfaces which are formed due to defining of the trenches, active regions formed in the trenches, and a gettering layer formed between the inner surfaces of the substrate body and the active regions, semiconductor devices formed on the active regions, and through electrodes passing through the peripheral region of the substrate body, the plurality of semiconductor chips being stacked such that the through electrodes are electrically connected with one another; and conductive connection members electrically connecting the through electrodes of the stacked semiconductor chips.

The active regions of each semiconductor chip may include monocrystalline silicon, and the gettering layer of each semiconductor chip may include polysilicon.

The semiconductor devices of each semiconductor chip may include at least one selected from the group consisting of an image sensor, a memory semiconductor, a system semiconductor, a passive element, an active element, and a sensor semiconductor.

Each semiconductor chip may further include a circuit pattern formed over the one surface of the substrate body and the active regions, and the circuit pattern may include: bonding pads formed on a first surface of the circuit pattern substantially facing away from a second surface of the circuit pattern which substantially faces the one surface of the substrate body and the active regions, and electrically connected with the through electrodes; wiring lines electrically connecting the semiconductor devices with the bonding pads; and a dielectric layer isolating the semiconductor devices and the wiring lines from each other, the wiring lines from each other, and the wiring lines and the bonding pads from each other.

The through electrodes may pass through the circuit pattern and may be directly connected with the bonding pads. Unlike this, the through electrodes may not pass through the circuit pattern, and the circuit pattern further may include additional wiring lines which electrically connect the through electrodes and the bonding pads with each other.

The stacked semiconductor package may further include: a first dielectric layer formed under a lower surface of a lowermost semiconductor chip among the stacked semiconductor chips and configured to expose the through electrodes of the lowermost semiconductor chip; redistribution lines formed under the first dielectric layer and electrically connected with the through electrodes exposed through the first dielectric layer; and a second dielectric layer formed under the first dielectric layer including the redistribution lines and configured expose a portion of the redistribution lines.

The stacked semiconductor package may further include a structural body supporting the semiconductor chips and including connection electrodes which are electrically connected with the through electrodes of the lowermost semiconductor chip among the stacked semiconductor chips. The structural body may include any one of a printed circuit board, an interposer and a semiconductor package.

DETAILED DESCRIPTION

Figure 1:
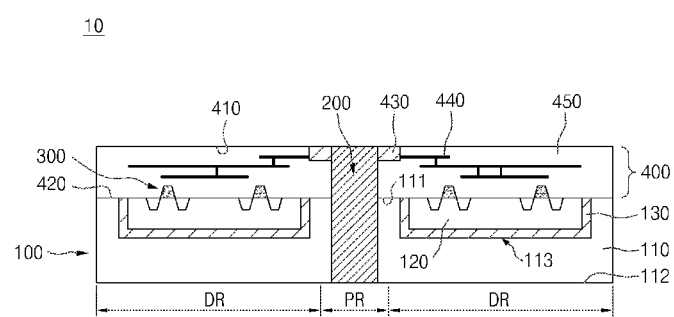
FIG. 1 is a cross-sectional view illustrating a semiconductor chip in accordance with an embodiment.

Hereafter, various embodiments will be described with reference to the accompanying drawings.

It is to be understood herein that the drawings are not necessarily to scale and in some instances proportions may have been exaggerated in order to more clearly depict certain features of the invention. In the drawings, like reference numerals refer to like elements throughout.

Figure 2:
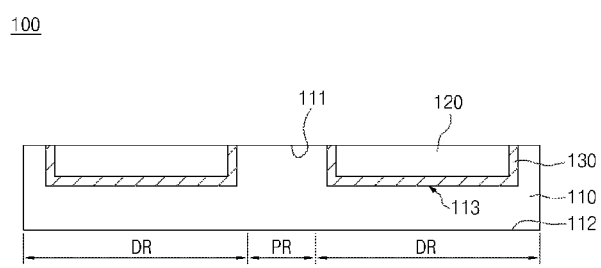
FIG. 2 is a cross-sectional view illustrating the semiconductor substrate illustrated in FIG. 1.

FIG. 1 is a cross-sectional view illustrating a semiconductor chip in accordance with an embodiment, and FIG. 2 is a cross-sectional view illustrating the semiconductor substrate illustrated in FIG. 1.

Referring to FIG. 1, a semiconductor chip 10 in accordance with a first an embodiment may include a semiconductor substrate 100, through electrodes 200, and semiconductor devices 300. Also, the semiconductor chip 10 may further include circuit pattern 400.

Referring to FIG. 2, the semiconductor substrate 100 may include a substrate body 110, active regions 120, and a gettering layer 130.

The substrate body 110 may be divided into device regions DR and a peripheral region PR. The substrate body 110 may have one surface 111, another surface 112 which substantially faces away from the one surface 111, trenches 113 which may be defined in the device regions DR under the one surface 111 and inner surfaces which are formed due to defining of the trenches 113.

The active regions 120 may be formed in the trenches 113 and may include monocrystalline silicon.

The gettering layer 130 may be formed between the inner surfaces of the substrate body and the active regions 120. The gettering layer 130 may include polysilicon.

The semiconductor substrate 100 may be fabricated on a wafer or may be individualized after being manufactured on a wafer.

Referring to FIG. 1, the through electrodes 200 pass through the peripheral region PR of the substrate body 110. A substance used as the through electrodes 200 may include at least one selected from the group consisting of copper, aluminum, an aluminum alloy, SnAg, and Au.

While not illustrated, a dielectric layer may be formed between the through electrodes 200 and the substrate body 110. The dielectric layer may include at least any one selected from the group consisting of an oxide layer, a nitride layer and an organic layer.

The semiconductor devices 300 may be formed on the active regions 120. The semiconductor devices 300 may include, for example, at least one selected from the group consisting of an image sensor, a memory semiconductor, a system semiconductor, a passive element, an active element, and a sensor semiconductor.

The circuit pattern 400 may be formed on the one surface 111 of the substrate body 110 and on the active regions 120. The circuit pattern 400 may include a first surface 410, a second surface 420, bonding pads 430, wiring lines 440, and a dielectric layer 450.

The first surface 410 may substantially face away from the second surface 420. The second surface 420 may substantially face the one surface 111 of the substrate body 110 and the active regions 120, and the bonding pads 430 may be disposed on the first surface 410 and may be electrically connected with the through electrodes 200.

The wiring lines 440 may electrically connect the semiconductor devices 300 with the bonding pads 430, and the dielectric layer 450 may isolate the semiconductor devices 300 and the wiring lines 440 from each other, the wiring lines 440 from each other, and the wiring lines 440 and the bonding pads 430 from each other.

In an embodiment, the through electrodes 200 may pass through the circuit pattern 400 and may be directly connected with the bonding pads 430. However, while not illustrated in a drawing, the through electrodes 200 may not pass through the circuit pattern 400, and in this case, the circuit pattern 400 may further include additional wiring lines (not illustrated)

which electrically connect the through electrodes 200 and the bonding pads 430 with each other.

Hereinafter, a stacked semiconductor package with the above-described semiconductor chip will be described.

Figure 3:
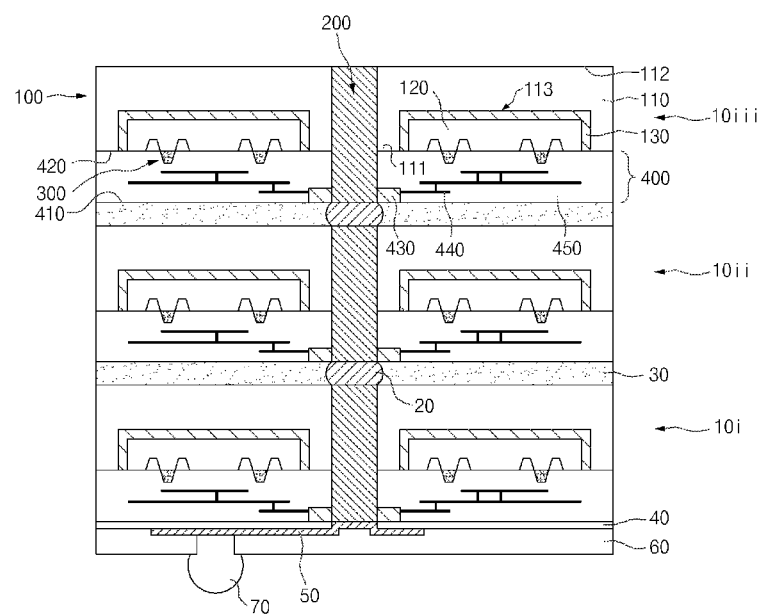
FIG. 3 is a cross-sectional view illustrating a stacked semiconductor package in accordance with an embodiment.

FIG. 3 is a cross-sectional view illustrating a stacked semiconductor package in accordance with an embodiment.

Referring to FIG. 3, after preparing a plurality of semiconductor chips 10*i*-*iii* each including a semiconductor substrate 100 which may be defined with active regions 120 formed in a gettering layer 130, through electrodes 200 and semiconductor devices 300. Second semiconductor chip 10*ii* may be stacked upon first semiconductor chip 10*i* such that through electrodes 200 of second semiconductor chip 10*ii* may be connected to the through electrodes 200 of the first semiconductor chip 10*i*. In this way, a plurality of semiconductor chips, for example, three semiconductor chips 10*i*-*iii* may be stacked upon one another.

Conductive connection members 20 may be formed between the through electrodes 200 of the stacked semiconductor chips 10*i*-*iii* to electrically connect the through electrodes 200 of the upper and lower semiconductor chips 10*i*-*iii*, and adhesive members 30 may be formed between the stacked semiconductor chips 10*i*-*iii* to attach the upper and lower semiconductor chips 10*i*-*iii* to each other.

The conductive connection members 20 may be formed of a metal including at least one of copper (Cu), tin (Sn) and silver (Ag), and the adhesive members 30 may include at least one among a non-conductive film (NCF), a non-conductive paste (NCP), an anisotropic conductive film (ACF), an anisotropic conductive paste (ACP), and polymer.

A first dielectric layer 40 may be formed under the lower surface of the first semiconductor chip 10*i* which is lowermost semiconductor chip among the stacked semiconductor chips 10*i*-*iii* in such a way so as to expose the through electrodes 200 of the first semiconductor chip 10*i*. Redistribution lines 50 may be formed under the first dielectric layer 40 that may be electrically connected with the through electrodes 200 of the first semiconductor chip 10*i*. A second dielectric layer 60 may be formed under the first dielectric layer 40 including the redistribution lines 50 in such a way as to expose portions of the redistribution lines 50. External connection terminals 70 may be mounted to the portions of the redistribution lines 50 which may be exposed through the second dielectric layer 60.

Figure 4:
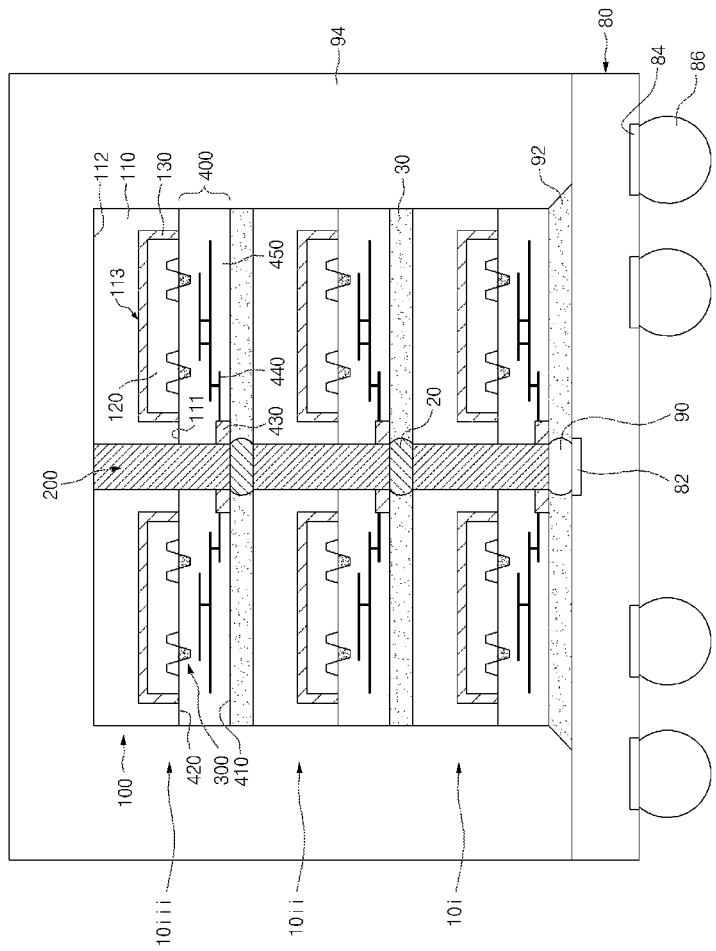
FIG. 4 is a cross-sectional view illustrating a stacked semiconductor package in accordance with an embodiment.

FIG. 4 is a cross-sectional view illustrating a stacked semiconductor package in accordance with an embodiment.

Referring to FIG. 4, after preparing a plurality of semiconductor chips 10*i*-*iii* each including a semiconductor substrate 100 which may be defined with active regions 120 formed in a gettering layer 130, through electrodes 200, and semiconductor devices 300. Second semiconductor chip 10*ii* may be stacked upon first semiconductor chip 10*i* such that through electrodes 200 of second semiconductor chip 10*ii* may be connected to the through electrodes 200 of the first semiconductor chip 10*i*. In this way, a plurality of semiconductor chips, for example, three semiconductor chips 10*i*-*iii* may be stacked upon one another.

Conductive connection members 20 may be formed between the through electrodes 200 of the stacked semiconductor chips 10*i*-*iii* to electrically connect the through electrodes 200 of the upper and lower semiconductor chips 10*i*-*iii*. Adhesive members 30 may be formed between the stacked semiconductor chips 10*i*-*iii* to attach upper and lower semiconductor chips 10*i*-*iii* to each other.

The conductive connection members 20 may be formed of a metal including at least one of copper (Cu), tin (Sn), and silver (Ag). The adhesive members 30 may include at least one among a non-conductive film (NCF), a non-conductive paste (NCP), an anisotropic conductive film (ACF), an anisotropic conductive paste (ACP), and polymer.

The stacked semiconductor chips 10*i*-*iii* may be mounted to a structural body 80 such that the through electrodes 200 of the first semiconductor chip 10*i* which is lowermost semiconductor chip among the stacked semiconductor chips 10*i*-*iii* may be electrically connected with connection electrodes 82 of the structural body 80. In an embodiment, the structural body 80 may include, for example, a printed circuit board (PCB).

The through electrodes 200 of the first semiconductor chip 10*i* and the connection electrodes 82 of the structural body 80 may be electrically connected with each other by conductive connection members 90. An adhesive member 92 may be formed between the first semiconductor chip 10*i* and the structural body 80 to attach the first semiconductor chip 10*i* and the structural body 80 to each other.

The conductive connection members 90 may be formed of a metal including at least one of copper (Cu), tin (Sn), and silver (Ag). The adhesive member 92 may include at least one among a non-conductive film (NCF), a non-conductive paste (NCP), an anisotropic conductive film (ACF), an anisotropic conductive paste (ACP), and polymer.

The upper surface of the structural body 80 including the stacked semiconductor chips 10*i*-*iii* may be sealed by a molding part 94. The reference numeral 84 designates ball lands, and 86 designates solder balls which may be used as external connection terminals.

While it was described in an embodiment illustrated in FIG. 4 that the structural body 80 may include a printed circuit board, it is to be noted that the structural body 80 may include a semiconductor package or an interposer.

The aforementioned semiconductor chips may be applied to various electronic apparatuses.

Figure 5:
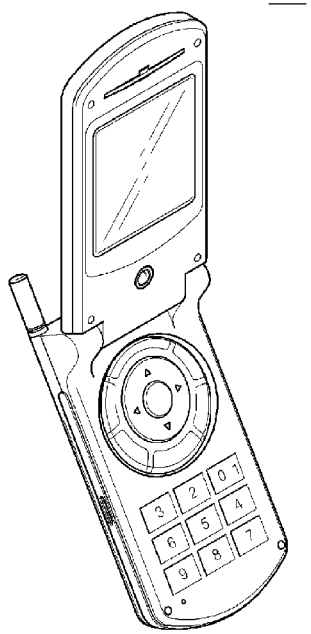
FIG. 5 is a perspective view illustrating an electronic apparatus having the semiconductor chip according to an embodiment.

FIG. 5 is a perspective view illustrating an electronic apparatus having the semiconductor chip according to an embodiment.

Referring to FIG. 5, the semiconductor chip according to the embodiments of the present invention may be applied to an electronic apparatus 1000 such as, for example, a portable phone. Since the semiconductor chip according to the embodiments have an excellent gettering characteristic, advantages are provided for improving the performance and reliability of the electronic apparatus 1000. The electronic apparatus 1000 is not limited to the portable phone illustrated in FIG. 5, and may include various electronic appliances, for example, such as a mobile electronic appliance, a laptop computer, a notebook computer, a portable multimedia player (PMP), an MP3 player, a camcorder, a web tablet, a wireless phone, a navigator, a personal digital assistant (PDA), and so forth.

Figure 6:
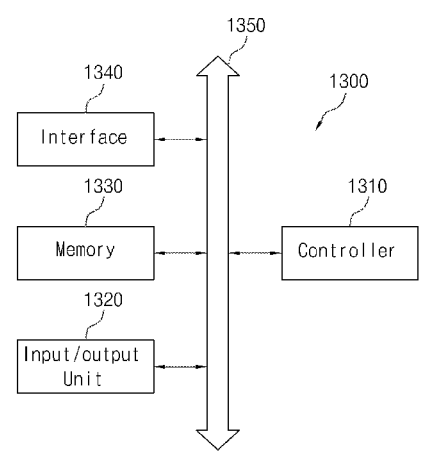
FIG. 6 is a block diagram illustrating an example of the electronic apparatus having the semiconductor chip according to an embodiment.

FIG. 6 is a block diagram illustrating an example of the electronic apparatus having the semiconductor chip according to an embodiment.

Referring to FIG. 6, an electronic system 1300 may include a controller 1310, an input/output unit 1320, and a memory 1330. The controller 1310, the input/output unit 1320, and the memory 1330 may be coupled with one another through a bus 1350. The bus 1350 serves as a path through which data may move. For example, the controller 1310 may include at least any one of at least one microprocessor, at least one digital signal processor, at least one microcontroller, and logic devices capable of performing the same functions as these components. The controller 1310 and the memory 1330 may include the semiconductor chip according to the embodiments. The input/output unit 1320 may include at least one selected among a keypad, a keyboard, a display device, and so forth. The memory 1330 may be a device for storing data. The memory 1330 may store data and/or commands to be executed by the controller 1310, and the likes. The memory 1330 may include a volatile memory device and/or a nonvolatile memory device. Otherwise, the memory 1330 may be constituted by a flash memory. For example, a flash memory to which the technology of the embodiments is applied may be mounted to an information processing system such as a mobile terminal or a desk top computer. The flash memory may be constituted by a solid state drive (SSD). In this case, the electronic system 1300 may stably store a large amount of data in a flash memory system. The electronic system 1300 may further include an interface 1340 configured to transmit and receive data to and from a communication network. The interface 1340 may be a wired or wireless type. For example, the interface 1340 may include an antenna or a wired or wireless transceiver. Further, while not illustrated, a person skilled in the art will readily appreciate that the electronic system 1300 may be additionally provided with an application chipset, a camera image processor (CIS), an input/output unit, etc.

As is apparent from the above description, according to the embodiments, since a metal to diffuse from through electrodes to active regions is effectively gettered by a gettering layer which is constituted by polysilicon formed under the active regions, a gettering characteristic may be improved. As a consequence, it is possible to prevent leakage current from occurring in a semiconductor device and a threshold voltage from shifting, and a refresh characteristic is improved, so that the reliability and performance of a product can be ameliorated.

Although specific embodiments have been described for illustrative purposes, those skilled in the art will appreciate that various modifications, additions, and substitutions are possible, without departing from the scope and the spirit of the embodiments as disclosed in the accompanying claims.

What is claimed is:

1. A semiconductor substrate comprising:
    a substrate body divided into device regions and a peripheral region outside the device region, and having one surface, another surface substantially facing away from the one surface, trenches defined in the device regions under the one surface, and inner surfaces which are formed due to defining of the trenches;
    active regions formed in the trenches and composed of monocrystalline silicon; and
    a gettering layer formed between the inner surfaces of the substrate body and the active regions and composed of polysilicon.

2. A semiconductor chip comprising:
    a semiconductor substrate including a substrate body divided into device regions and a peripheral region outside the device region, and having one surface, another surface substantially facing away from the one surface, trenches defined in the device regions under the one surface, and inner surfaces which are formed due to defining of the trenches, active regions formed in the trenches and composed of monocrystalline silicon, and a gettering layer formed between the inner surfaces of the substrate body and the active regions and composed of polysilicon;
    semiconductor devices formed under the active regions; and
    through electrodes passing through the peripheral region of the substrate body.

3. The semiconductor chip according to claim 2, wherein the semiconductor devices comprise at least one selected from the group consisting of an image sensor, a memory semiconductor, a system semiconductor, a passive element, an active element, and a sensor semiconductor.

4. The semiconductor chip according to claim 2, further comprising:
    a circuit pattern formed on the one surface of the substrate body and the active regions,
    wherein the circuit pattern comprises:
        bonding pads formed on a first surface of the circuit pattern substantially facing away from a second surface of the circuit pattern which substantially faces the one surface of the substrate body and the active regions, and electrically connected with the through electrodes;
        wiring lines electrically connecting the semiconductor devices with the bonding pads; and
        a dielectric layer isolating the semiconductor devices and the wiring lines from each other, the wiring lines from each other, and the wiring lines and the bonding pads from each other.

5. The semiconductor chip according to claim 4, wherein the through electrodes pass through the circuit pattern and are directly connected with the bonding pads.

6. The semiconductor chip according to claim 4, wherein the through electrodes do not pass through the circuit pattern, and the circuit pattern further comprises additional wiring lines which electrically connect the through electrodes and the bonding pads with each other.

7. A stacked semiconductor package comprising:
    a plurality of semiconductor chips each including a semiconductor substrate including a substrate body divided into device regions and a peripheral region outside the device region, and having one surface, another surface substantially facing away from the one surface, trenches defined in the device regions under the one surface and inner surfaces which are formed due to defining of the trenches, active regions formed in the trenches and composed of monocrystalline silicon, and a gettering layer formed between the inner surfaces of the substrate body and the active regions and composed of polysilicon, semiconductor devices formed on the active regions, and through electrodes passing through the peripheral region of the substrate body, the plurality of semiconductor chips being stacked such that the through electrodes are electrically connected with one another; and
    conductive connection members electrically connecting the through electrodes of the stacked semiconductor chips.

8. The stacked semiconductor package according to claim 7, wherein the semiconductor devices of each semiconductor chip comprise at least one selected from the group consisting of an image sensor, a memory semiconductor, a system semiconductor, a passive element, an active element, and a sensor semiconductor.

9. The stacked semiconductor package according to claim 7,
    wherein each semiconductor chip further comprises a circuit pattern formed on the one surface of the substrate body and the active regions, and
    wherein the circuit pattern comprises:
        bonding pads formed on a first surface of the circuit pattern substantially facing away from a second surface of the circuit pattern which substantially faces the one surface of the substrate body and the active regions, and electrically connected with the through electrodes;

wiring lines electrically connecting the semiconductor devices with the bonding pads; and a dielectric layer isolating the semiconductor devices and the wiring lines from each other, the wiring lines from each other, and the wiring lines and the bonding pads from each other.

10. The stacked semiconductor package according to claim 9, wherein the through electrodes pass through the circuit pattern and are directly connected with the bonding pads.

11. The stacked semiconductor package according to claim 9, wherein the through electrodes do not pass through the circuit pattern, and the circuit pattern further comprises additional wiring lines which electrically connect the through electrodes and the bonding pads with each other.

12. The stacked semiconductor package according to claim 7, further comprising:

a first dielectric layer formed under a lower surface of a lowermost semiconductor chip among the stacked semiconductor chips and configured to expose the through electrodes of the lowermost semiconductor chip;

redistribution lines formed under the first dielectric layer and electrically connected with the through electrodes exposed through the first dielectric layer; and a second dielectric layer formed under the first dielectric layer including the redistribution lines and configured to expose a portion of the redistribution lines.

13. The stacked semiconductor package according to claim 7, further comprising:

a structural body supporting the semiconductor chips and including connection electrodes which are electrically connected with the through electrodes of a lowermost semiconductor chip among stacked semiconductor chips.

14. The stacked semiconductor package according to claim 13, wherein the structural body comprises any one of a printed circuit board, an interposer, and a semiconductor package.

\* \* \* \* \*